US011081170B2

(12) United States Patent
Chiang

(10) Patent No.: US 11,081,170 B2
(45) Date of Patent: Aug. 3, 2021

(54) APPARATUS AND METHODS FOR PROGRAMMING MEMORY CELLS RESPONSIVE TO AN INDICATION OF AGE OF THE MEMORY CELLS

(71) Applicant: MICRON TECHNOLOGY, INC., Boise, ID (US)

(72) Inventor: Pin-Chou Chiang, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/225,036

(22) Filed: Dec. 19, 2018

(65) Prior Publication Data
US 2020/0202926 A1 Jun. 25, 2020

(51) Int. Cl.
*G11C 11/56* (2006.01)
*G11C 16/04* (2006.01)
*G11C 16/10* (2006.01)
*G11C 16/34* (2006.01)

(52) U.S. Cl.
CPC ...... *G11C 11/5628* (2013.01); *G11C 16/0483* (2013.01); *G11C 16/10* (2013.01); *G11C 16/3495* (2013.01)

(58) Field of Classification Search
CPC .................................................. G11C 11/5628
See application file for complete search history.

(56) References Cited

U.S. PATENT DOCUMENTS

| 7,239,557 | B2 | 7/2007 | Ha |
| 7,408,810 | B2 | 8/2008 | Aritome et al. |
| 7,679,961 | B2 | 3/2010 | Lee et al. |
| 7,983,088 | B2 | 7/2011 | Moschiano et al. |
| 8,036,035 | B2 | 10/2011 | Moschiano et al. |
| 8,117,375 | B2 | 2/2012 | Sarin et al. |
| 8,385,123 | B2 | 2/2013 | Jones |
| 8,737,131 | B2 | 5/2014 | Sakui |
| 8,902,648 | B2 | 12/2014 | Vali et al. |
| 9,281,078 | B2 | 3/2016 | Kessenich et al. |
| 2008/0117688 | A1* | 5/2008 | Park ................ G11C 16/3454 365/185.22 |
| 2009/0103371 | A1* | 4/2009 | Goda ............... G11C 16/3468 365/185.29 |
| 2012/0239858 | A1* | 9/2012 | Melik-Martirosian ........ G11C 16/12 711/103 |
| 2013/0258774 | A1* | 10/2013 | Visconti ............. G11C 16/10 365/185.09 |

* cited by examiner

*Primary Examiner* — Douglas King
(74) *Attorney, Agent, or Firm* — Dicke, Billig & Czaja, PLLC

(57) ABSTRACT

Methods of operating a memory, and memory configured to perform similar methods, may include applying a first plurality of programming pulses to control gates of a plurality of memory cells during a particular programming operation and applying a second plurality of programming pulses to the control gates of the plurality of memory cells during a subsequent programming operation, wherein the first plurality of programming pulses have a particular slope, and wherein the second plurality of programming pulses have a different slope less than the particular slope. Methods of configuring a memory may include characterizing a read window budget for a programming operation of the memory as a function of a programming step voltage for a plurality of memory cell ages.

20 Claims, 14 Drawing Sheets

APPARATUS AND METHODS FOR PROGRAMMING MEMORY CELLS RESPONSIVE TO AN INDICATION OF AGE OF THE MEMORY CELLS

TECHNICAL FIELD

The present disclosure relates generally to memory and, in particular, in one or more embodiments, the present disclosure relates to apparatus and methods for programming memory cells responsive to an indication of age of the memory cells.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC may use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Programming memory cells typically utilizes an iterative process of applying a programming pulse to a memory cell and verifying if that memory cell has reached its desired data state in response to that programming pulse, and repeating that iterative process until that memory cell passes the verification. Once a memory cell passes the verification, it may be inhibited from further programming. The iterative process can be repeated with changing (e.g., increasing) voltage levels of the programming pulse until each memory cell selected for the programming operation has reached its respective desired data state, or some failure is declared, e.g., reaching a maximum number of allowed programming pulses during the programming operation. Given the iterative nature of programming operations, and the relatively high voltage levels each iteration uses, programming operations can be significant influences on both the speed and power consumption of a memory.

DETAILED DESCRIPTION

Figure 1:
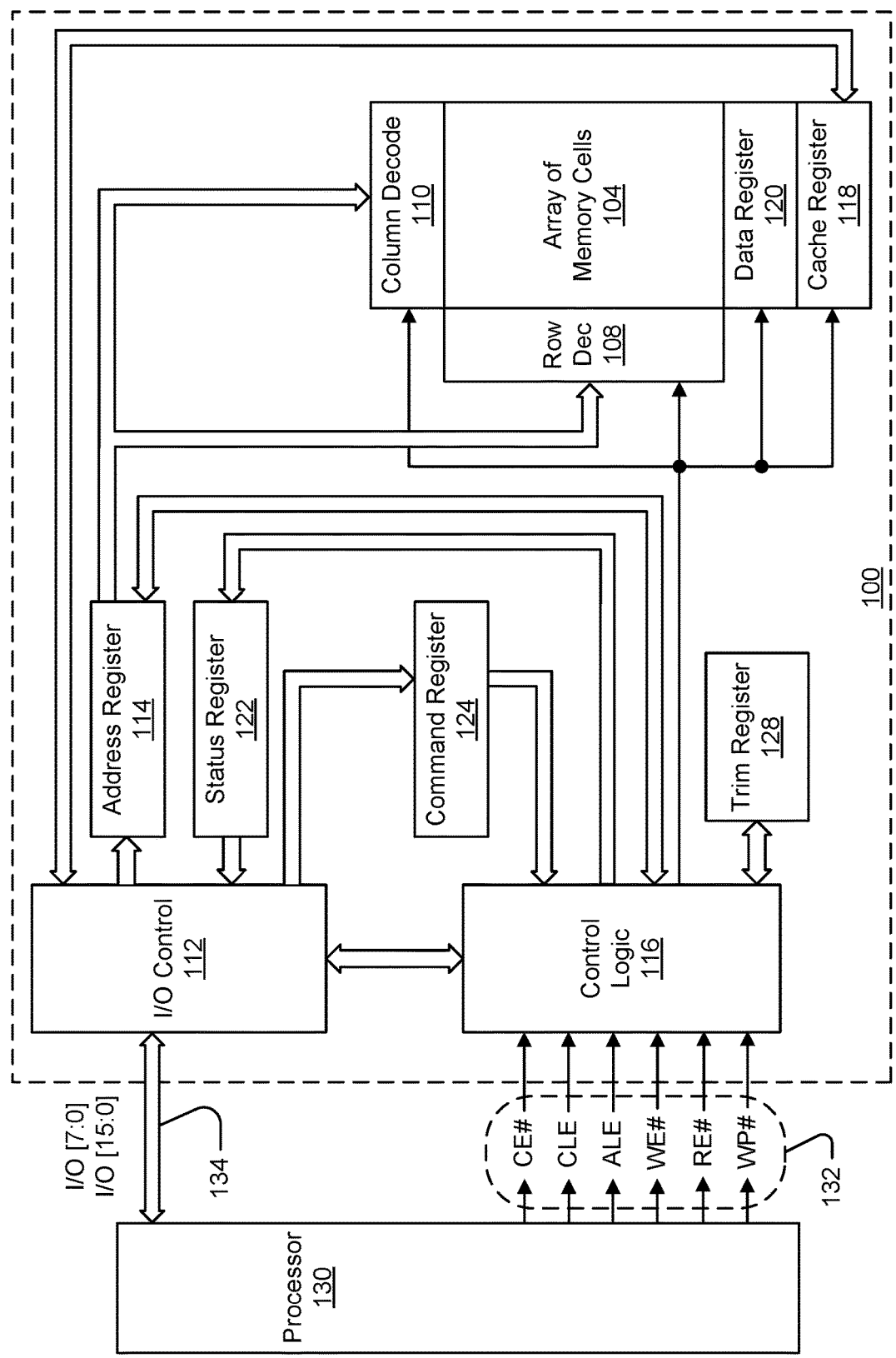
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A trim register 128 may be in communication with the control logic 116. The trim register 128 might represent a volatile memory, latches or other storage location, volatile or non-volatile. For some embodiments, the trim register 128 might represent a portion of the array of memory cells 104. The trim register 128 might store information relating to the determination of an age of memory cells, the determination of programming step voltages, and/or the determination of programming start voltages, in accordance with embodiments. The control logic 116 might be configured to perform methods of operating a memory in accordance with embodiments.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
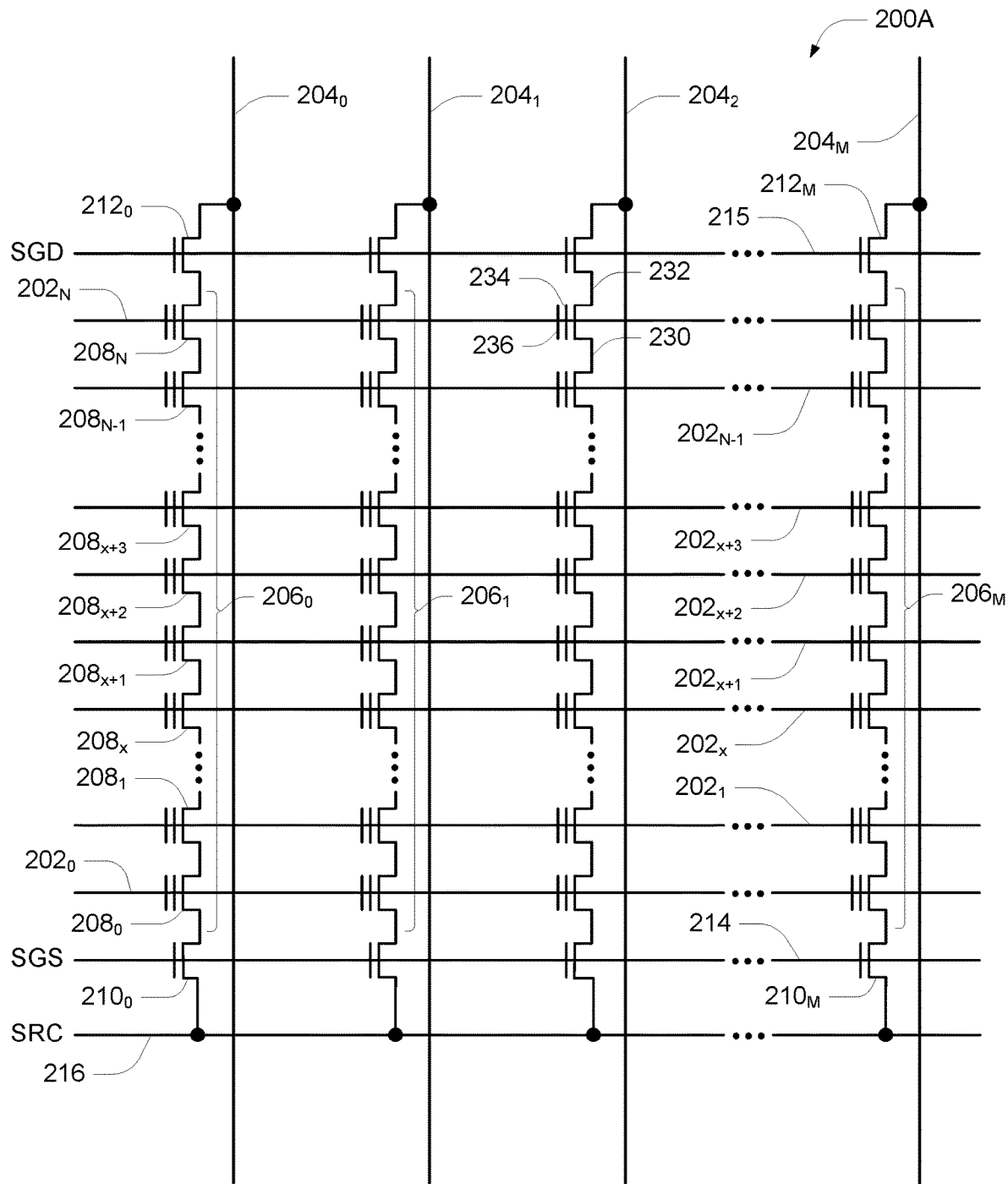
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
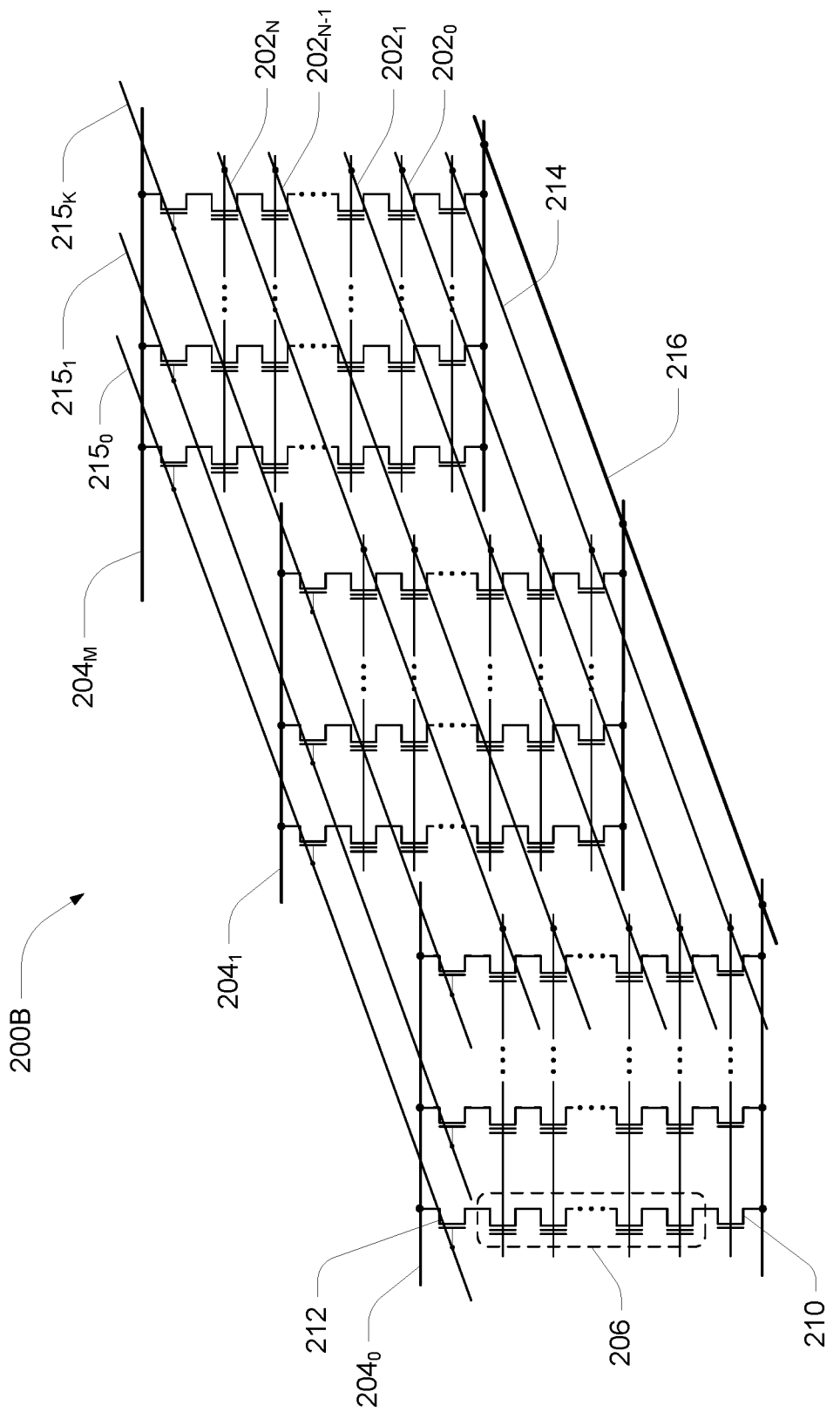

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
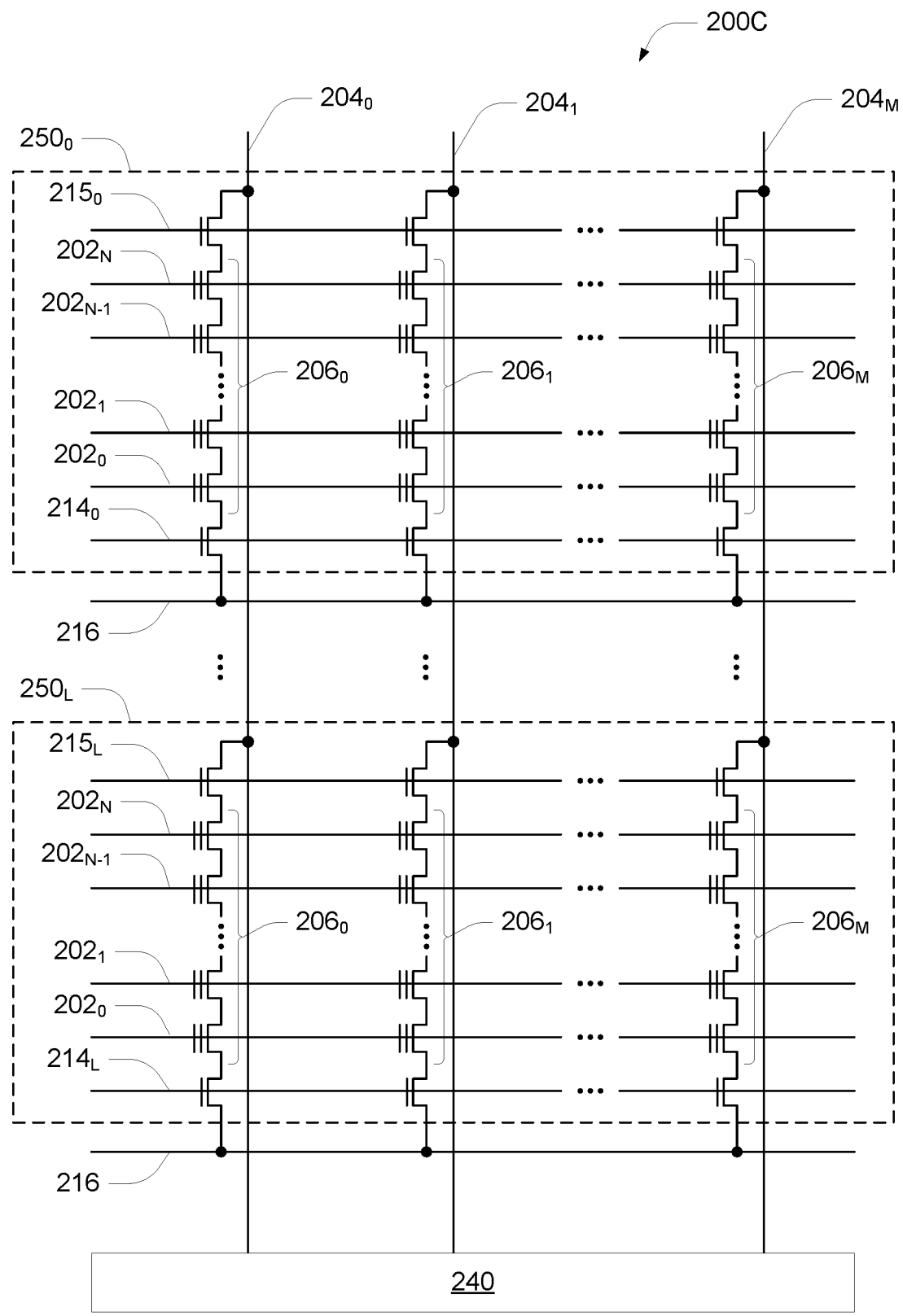

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$-$250_L$.

The data lines $204_0$-$204_M$ may be connected (e.g., selectively connected) to a buffer portion 240, which might be a portion of a page buffer of the memory. The buffer portion 240 might correspond to a memory plane (e.g., the set of blocks of memory cells $250_0$-$250_L$). The buffer portion 240 might include sensing devices (not shown) for sensing data values indicated on respective data lines 204, and corresponding registers (not shown) for storage of the sensed data values from its corresponding memory plane.

Figure 3:
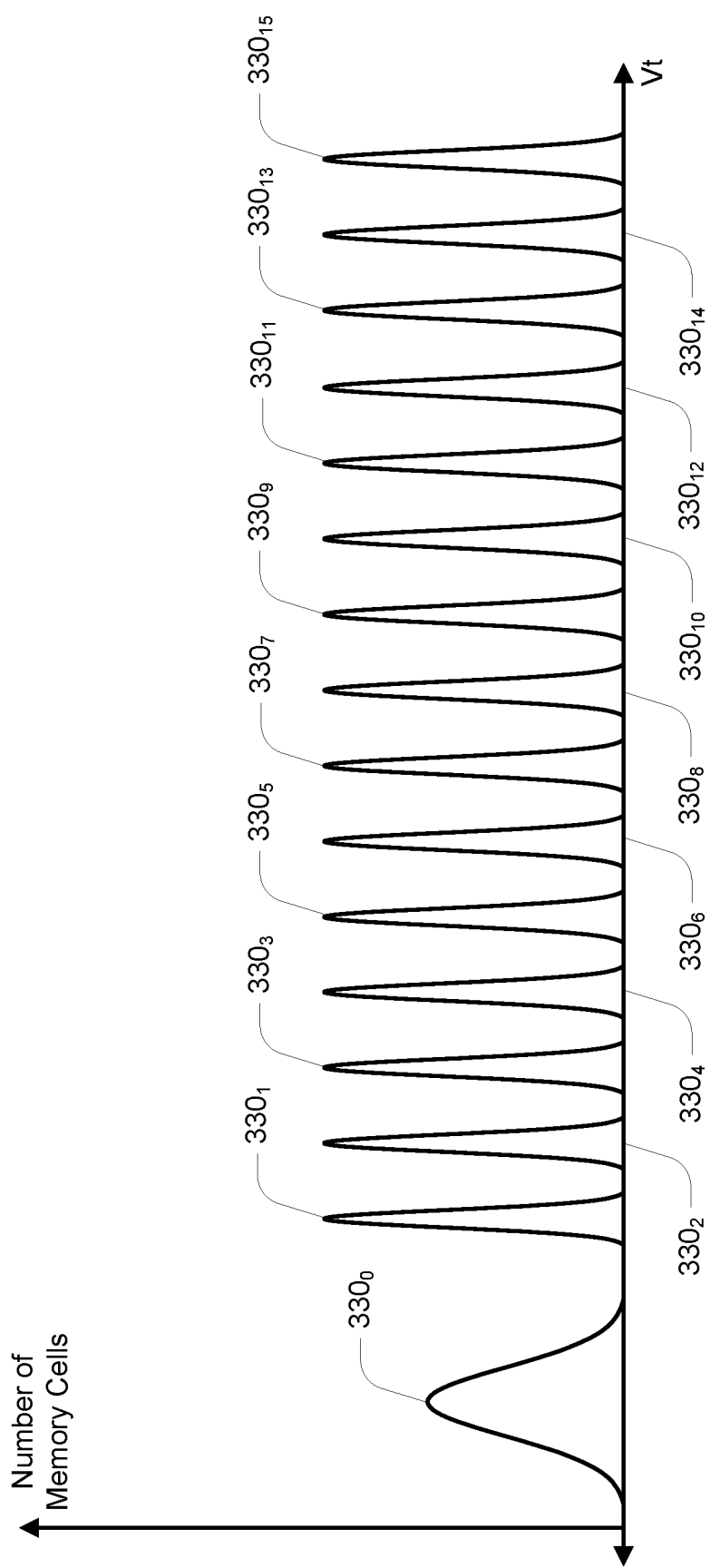
FIG. 3 is a conceptual depiction of threshold voltage ranges of a plurality of memory cells.

FIG. 3 is a conceptual depiction of threshold voltage ranges of a plurality of memory cells. FIG. 3 illustrates an example of threshold voltage ranges and their distributions for a population of a sixteen-level memory cells, often referred to as QLC memory cells. For example, such a memory cell might be programmed to a threshold voltage (Vt) that falls within one of sixteen different threshold voltage ranges $330_0$-$330_{15}$, each being used to represent a data state corresponding to a bit pattern of four bits. The threshold voltage range $330_0$ typically has a greater width than the remaining threshold voltage ranges $330_1$-$330_{15}$ as memory cells are generally all placed in the data state corresponding to the threshold voltage range $330_0$, then subsets of those memory cells are subsequently programmed to have threshold voltages in one of the threshold voltage ranges $330_1$-$330_{15}$. As programming operations are generally more incrementally controlled than erase operations, these threshold voltage ranges $330_1$-$330_{15}$ may tend to have tighter distributions.

The threshold voltage ranges $330_0$, $330_1$, $330_2$, $330_3$, $330_4$, $330_5$, $330_6$, $330_7$, $330_8$, $330_9$, $330_{10}$, $330_{11}$, $330_{12}$, $330_{13}$, $330_{14}$ and $330_{15}$ might each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $330_0$, the memory cell in this case may be storing a data state L0 having a data value of logical '1111' and is typically referred to as the erased state of the memory cell. If the threshold voltage is within the second of the sixteen threshold voltage ranges $330_1$, the memory cell in this case may be storing a data state L1 having a data value of logical '0111'. If the threshold voltage is within the third of the sixteen threshold voltage ranges $330_2$, the memory cell in this case may be storing a data state L2 having a data value of logical '0011', and so on. Table 1 provides one possible correspondence between the data states and their corresponding logical data values. Other assignments of data states to logical data values are known. Memory cells remaining in the lowest data state (e.g., the erased state or L0 data state), as used herein, will be deemed to be programmed to the lowest data state. The information of Table 1 might be contained within the trim register 128, for example.

TABLE 1

| Data State | Logical Data Value |
|---|---|
| L0 | 1111 |
| L1 | 0111 |
| L2 | 0011 |
| L3 | 1011 |
| L4 | 1001 |

TABLE 1-continued

| Data State | Logical Data Value |
| --- | --- |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

Following programming, threshold voltages of memory cells may shift due to such phenomena as quick charge loss (QCL). QCL is a de-trapping of electrons near a gate dielectric interface out to the channel region of the memory cell, and can cause a Vt shift shortly after a programming pulse. When a memory cell passes the verify operation, the programmed threshold voltage may appear to be higher due to the trapped charge in the gate dielectric. When the memory cell is read after the program operation has been completed, the memory cell may have a Vt that is lower than the Vt obtained during the program verify operation due to the charge in the gate dielectric leaking out to the channel region. Threshold voltages of memory cells may further shift due to cumulative charge loss over the age of their programmed data, e.g., a period of time between programming the data and reading the data, referred to herein as data age. Data age is often indicated in terms of time decades subsequent to programming. Time decades are typically defined such that X time decades equals $10^X$ seconds, e.g., 0 time decades equals 1 second, 1 time decade equals 10 seconds, 2 time decades equals 100 seconds, etc. Memory cell age, as opposed to data age, is often indicated in terms of a number of program/erase cycles the memory cells have experienced.

FIGS. 4A-4D are conceptual depictions of threshold voltage distributions of a plurality of memory cells following a programming operation. The threshold voltage distributions $430_d$-$430_{d+2}$ of FIG. 4A might represent some portion of the distributions for threshold voltage ranges $330_0$-$330_{15}$ of FIG. 3 at the completion of a programming operation for memory cells having a particular memory cell age, e.g., memory cells having experienced a particular number of program/erase cycles, while threshold voltage distributions $432_d$-$432_{d+2}$ of FIG. 4B might represent the same portion of the distributions for threshold voltage ranges $330_0$-$330_{15}$ of FIG. 3 at the completion of a programming operation for memory cells having a different memory cell age, e.g., memory cells having experienced a different number of program/erase cycles, greater than the particular number of program/erase cycles. Both of the programming operations might utilize a same programming step size between adjacent programming pulses.

Figure 4A:
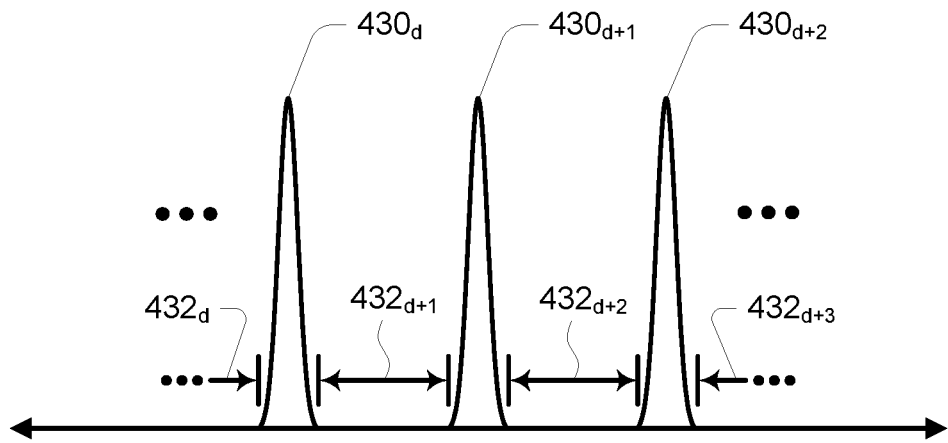
FIGS. 4A-4D are conceptual depictions of threshold voltage distributions of a plurality of memory cells at various data ages and various memory cell ages.

With reference to FIG. 4A, adjacent threshold voltage distributions 430 are typically separated by some margin (e.g., dead space) 432 at the completion of programming. For example, the threshold voltage distribution $430_d$ might be separated from a next lower threshold voltage distribution (not shown in FIG. 4A) by margin $432_d$, and separated from a next higher threshold voltage distribution, e.g., threshold voltage distribution $430_{d+1}$, by margin $432_{d+1}$. Similarly, the threshold voltage distribution $430_{d+1}$ might be separated from a next higher threshold voltage distribution, e.g., threshold voltage distribution $430_{d+2}$, by margin $432_{d+2}$, the threshold voltage distribution $430_{d+2}$ might be separated from a next higher threshold voltage distribution (not shown in FIG. 4A) by margin $432_{d+3}$, and so on. The sum of the margins 432 for each of the threshold voltage distributions 430 might be referred to as a read window budget (RWB).

Figure 4B:
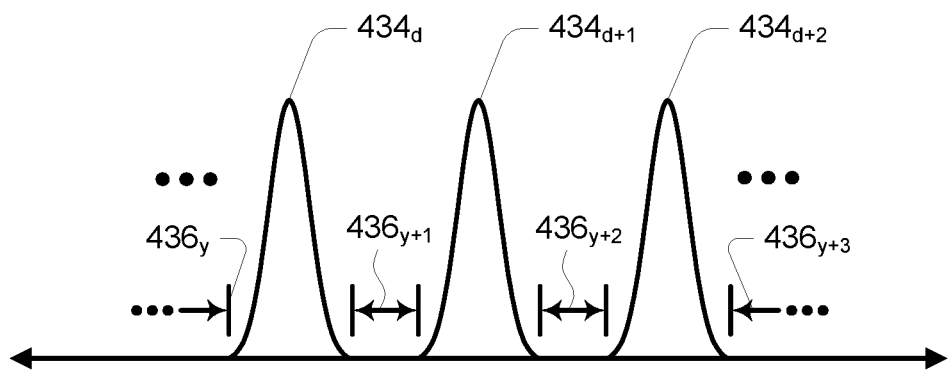

With reference to FIG. 4B, adjacent threshold voltage distributions 434 are typically separated by some margin (e.g., dead space) 436 at the completion of programming. For example, the threshold voltage distribution $434_d$ might be separated from a next lower threshold voltage distribution (not shown in FIG. 4B) by margin $436_d$, and separated from a next higher threshold voltage distribution, e.g., threshold voltage distribution $434_{d+1}$, by margin $436_{d+1}$. Similarly, the threshold voltage distribution $434_{d+1}$ might be separated from a next higher threshold voltage distribution, e.g., threshold voltage distribution $434_{d+2}$, by margin $436_{d+2}$, the threshold voltage distribution $434_{d+2}$ might be separated from a next higher threshold voltage distribution (not shown in FIG. 4B) by margin $436_{d+3}$, and so on. The sum of the margins 436 for each of the threshold voltage distributions 434 might similarly be referred to as a read window budget (RWB).

For programming operations utilizing an iterative process of applying increasing programming pulses to an access line (e.g., connected to control gates of the memory cells), the RWB is generally highly dependent upon the programming step size, e.g., the voltage difference between adjacent programming pulses. However, the RWB is further dependent upon the age of the memory cells as memory cells experiencing higher numbers of program/erase cycles often generally exhibit higher degrees of coupling between adjacent charge storage structures (e.g., floating-gate structures) and higher degrees of quick charge loss. As such, even where the memory cells having the particular memory cell age of FIG. 4A and the memory cells having the different memory cell age of FIG. 4B are programmed utilizing the same programming step size, their RWBs might be different. Accordingly, the sum of the margins 436 of FIG. 4B might be less than the sum of the margins 432 of FIG. 4A.

Figure 4C:
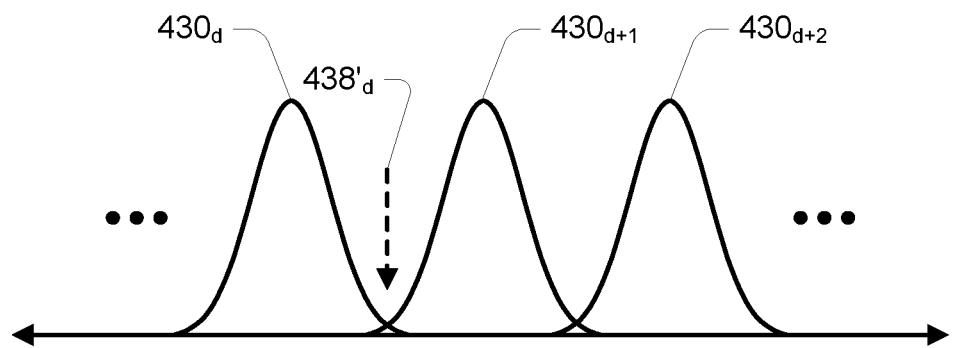
Figure 4D:
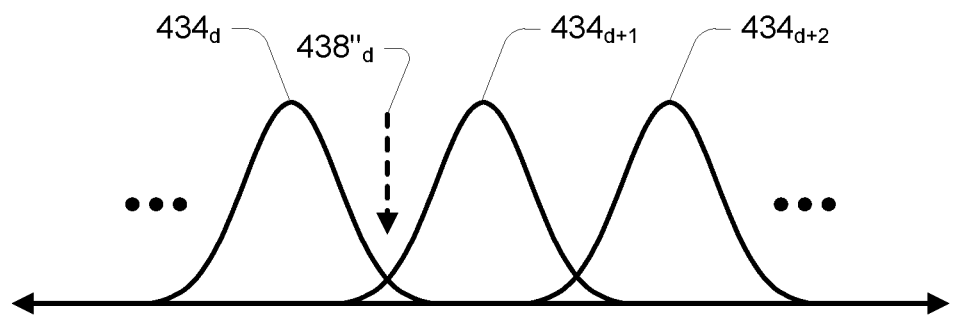

As previously noted, memory cells also generally experience time-dependent charge loss subsequent to programming. This is depicted in FIGS. 4C and 4D for the memory cells of lesser and greater memory cell ages, respectively. The threshold voltage distributions $430_d$-$430_{d+2}$ of FIG. 4C might represent the threshold voltage shifts of the threshold voltage distributions $430_d$-$430_{d+2}$ of FIG. 4A at a particular data age (e.g., a particular number of time decades subsequent to programming), and the threshold voltage distributions $434_d$-$434_{d+2}$ of FIG. 4D might represent the threshold voltage shifts of the threshold voltage distributions $434_d$-$434_{d+2}$ of FIG. 4B at the particular data age. Although time-dependent charge loss is generally dependent upon data age, because the threshold voltage distributions $430_d$-$430_{d+2}$ of FIG. 4A exhibited a greater RWB and the threshold voltage distributions $434_d$-$434_{d+2}$ of FIG. 4B, the threshold voltage distributions $430_d$-$430_{d+2}$ of FIG. 4C also exhibit a lesser degree of overlap than the threshold voltage distributions $434_d$-$434_{d+2}$ of FIG. 4D.

With reference to FIG. 4C, a read voltage $438'_d$ might be applied to the control gates of the plurality of memory cells during a read operation. When read voltages are applied in increasing order during the read operation, memory cells first activating in response to the read voltage $438'_d$ might be determined to have the data state corresponding to the threshold voltage distribution $430_d$. Read operations are well understood in the art and will not be further detailed herein. Due to the overlap of the threshold voltage distributions $430_d$ and $430_{d+1}$ in FIG. 4C, resulting from the threshold voltage shifts, some memory cells of the threshold voltage distribution $430_d$ will be incorrectly identified as belonging to a data state other than the data state corresponding to the threshold voltage distribution $430_d$, and some memory cells of the threshold voltage distribution $430_{d+1}$ will be incorrectly identified as belonging to the data state corresponding to the threshold voltage distribution $430_d$.

With reference to FIG. 4D, a read voltage $438''_d$ might be applied to the control gates of the plurality of memory cells during a read operation. When read voltages are applied in increasing order during the read operation, memory cells first activating in response to the read voltage $438''_d$ might be determined to have the data state corresponding to the threshold voltage distribution $434_d$. Due to the overlap of the threshold voltage distributions $434_d$ and $434_{d+1}$ in FIG. 4D, resulting from the threshold voltage shifts, some memory cells of the threshold voltage distribution $434_d$ will be erroneously determined to belong to a data state other than the data state corresponding to the threshold voltage distribution $434_d$, and some memory cells of the threshold voltage distribution $434_{d+1}$ will be erroneously determined to belong to the data state corresponding to the threshold voltage distribution $434_d$. However, as the overlap of the threshold voltage distributions $434_d$ and $434_{d+1}$ in FIG. 4D is larger than the overlap of the threshold voltage distributions $430_d$ and $430_{d+1}$ in FIG. 4C, a larger number of memory cells would be erroneously determined to correspond to a data state different than their intended data state. It is noted that due to the different degrees of threshold voltage shifts between the memory cells of FIG. 4C and the memory cells of FIG. 4D, the read voltage $438''_d$ might be lower than the $438'_d$.

Error correction schemes are commonly used to identify and correct erroneous digits of data. However, error correction schemes have limitations on the number of errors they are capable of identifying and correcting. Some known error correction schemes might utilize error correction code (ECC) data conforming to Hamming codes, horizontal/vertical parity codes, convolution codes, Recursive Systematic Codes (RSC), Trellis-Coded Modulation (TCM), Block Coded Modulation (BCM), Bose-Chaudhuri-Hocquenghem (BCH) codes, Reed-Solomon codes, turbo codes, cyclic redundancy codes (CRC) or low density parity check (LDPC) codes, although this disclosure is not limited to a particular error correction scheme or its coding. The number of correctable errors generally can be increased through the use of larger amounts of error correction code data, or through the use of more robust error correction schemes, but these generally require more storage space and more computation time, respectively, to effect the corrections. Regardless of the number of correctable errors, the programming step size for an iterative programming operation has typically been determined to allow the selected error correction scheme to correct all expected errors for a selected level of data retention, e.g., desired maximum data age, of the memory cells at their expected end of life, e.g., a desired maximum memory cell age. Error correction of data errors is well understood in the art and will not be detailed herein.

Figure 5:
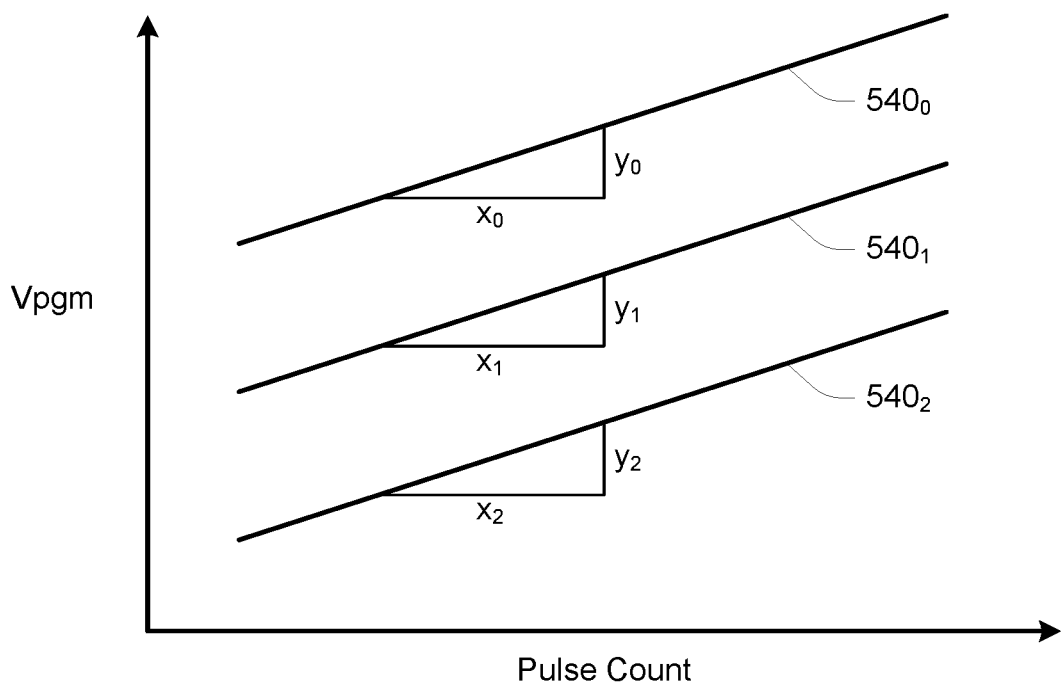
FIG. 5 is a conceptual depiction of programming voltages as a function of pulse count for various memory cell ages.

FIG. 5 is a conceptual depiction of programming voltages as a function of pulse count for various memory cell ages. Line $540_0$ might represent a plot of the voltage levels of a plurality of programming pulses used to program a plurality of memory cells at a first memory cell age. Line $540_1$ might represent a plot of the voltage levels of a plurality of programming pulses used to program a plurality of memory cells at a second memory cell age greater than the first memory cell age. Line $540_2$ might represent a plot of the voltage levels of a plurality of programming pulses used to program a plurality of memory cells at a third memory cell age greater than the second memory cell age. As depicted, the programming voltages (Vpgm) generally decrease as the memory cells age, as a memory cell that has been through no or very few program/erase cycles will typically require application of a higher voltage at its control gate to raise its threshold voltage by a particular amount as compared to a memory cell that has been through a higher number of cycles. In addition, the slopes of each of the lines 540 are generally expected to satisfy the condition that $y_0/x_0=y_1/x_1=y_2/x_2$.

Programming a plurality of memory cells at the first memory cell age, the second memory cell age and the third memory cell age utilizing the programming voltages of lines $540_0$, $540_1$ and $540_2$, respectively, might be expected to produce threshold voltage distributions with decreasing magnitudes of RWB. The RWB for the memory cells having the third memory cell age might be an RWB that is sufficient to facilitate error correction for those memory cells following the expected threshold voltage shifts, such as described with reference to FIG. 4D. Error correction would also be facilitated for lesser memory cell ages, e.g., the first memory cell age and the second memory cell age.

While selecting a programming step size to facilitate error correction of memory cells having higher memory cell ages, e.g., the third memory cell age, might also facilitate error correction for lesser memory cell ages, e.g., the first memory cell age and the second memory cell age, the error correction capabilities might be underutilized. For various embodiments, improvements in programming time (e.g., and possible accompanying improvements in power consumption) might be facilitated by targeting an RWB that might be near the limits of the selected error correction scheme for a variety of memory cell ages. Programming time might be inversely proportional (e.g., directly inversely proportional) to the slope of the programming voltages utilized for programming memory cells.

Figure 6:
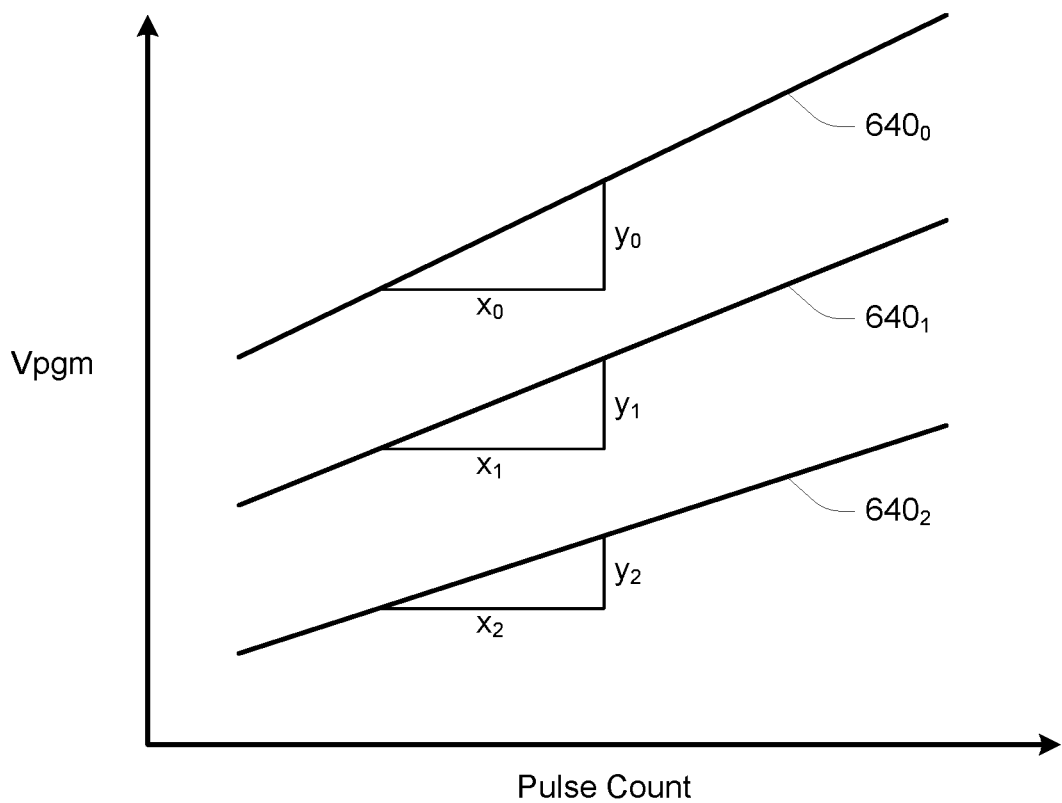
FIG. 6 is a conceptual depiction of programming voltages as a function of pulse count for various memory cell ages in accordance with an embodiment.

FIG. 6 is a conceptual depiction of programming voltages as a function of pulse count for various memory cell ages in accordance with an embodiment. Line $640_0$ might represent a plot of the voltage levels of a plurality of programming pulses used to program a plurality of memory cells at a first memory cell age, e.g., some particular number of program/erase cycles. Line $640_1$ might represent a plot of the voltage levels of a plurality of programming pulses used to program a plurality of memory cells at a second memory cell age greater than (e.g., a greater number of program/erase cycles than) the first memory cell age. Line $640_2$ might represent a plot of the voltage levels of a plurality of programming pulses used to program a plurality of memory cells at a third memory cell age greater than (e.g., a greater number of program/erase cycles than) the second memory cell age. As depicted, the programming voltages (Vpgm) generally decrease as the memory cells age, as a memory cell that has been through no or very few program/erase cycles will typically require application of a higher voltage at its control gate to raise its threshold voltage by a particular amount as compared to a memory cell that has been through a higher number of cycles. In addition, the slopes of the lines 640 generally decrease as the memory cells age. For example, the slopes of each of the lines 640 might be expected to satisfy the condition that $y_0/x_0 > y_1/x_1 > y_2/x_2$. For some embodiments, programming operations at two different memory cell ages might utilize the same slopes for their programming voltages. For example, programming a memory cell having a memory cell age corresponding to Z program/erase cycles might utilize a same slope for its programming voltages as programming a memory cell having a memory cell age corresponding to Z+1 program/erase cycles.

Programming a plurality of memory cells at the first memory cell age, the second memory cell age and the third memory cell age utilizing the programming voltages of lines $640_0$, $640_1$ and $640_2$, respectively, might be expected to produce threshold voltage distributions with magnitudes of RWB that might be within a narrower range of values (e.g., near constant) than the magnitudes of RWB produced using constant slopes for programming voltages at each memory cell age. The RWBs for the memory cells having the first memory cell age, the second memory cell age, and the third memory cell age might each be RWBs that are sufficient to facilitate error correction for those memory cells following the expected threshold voltage shifts.

Figure 7A:
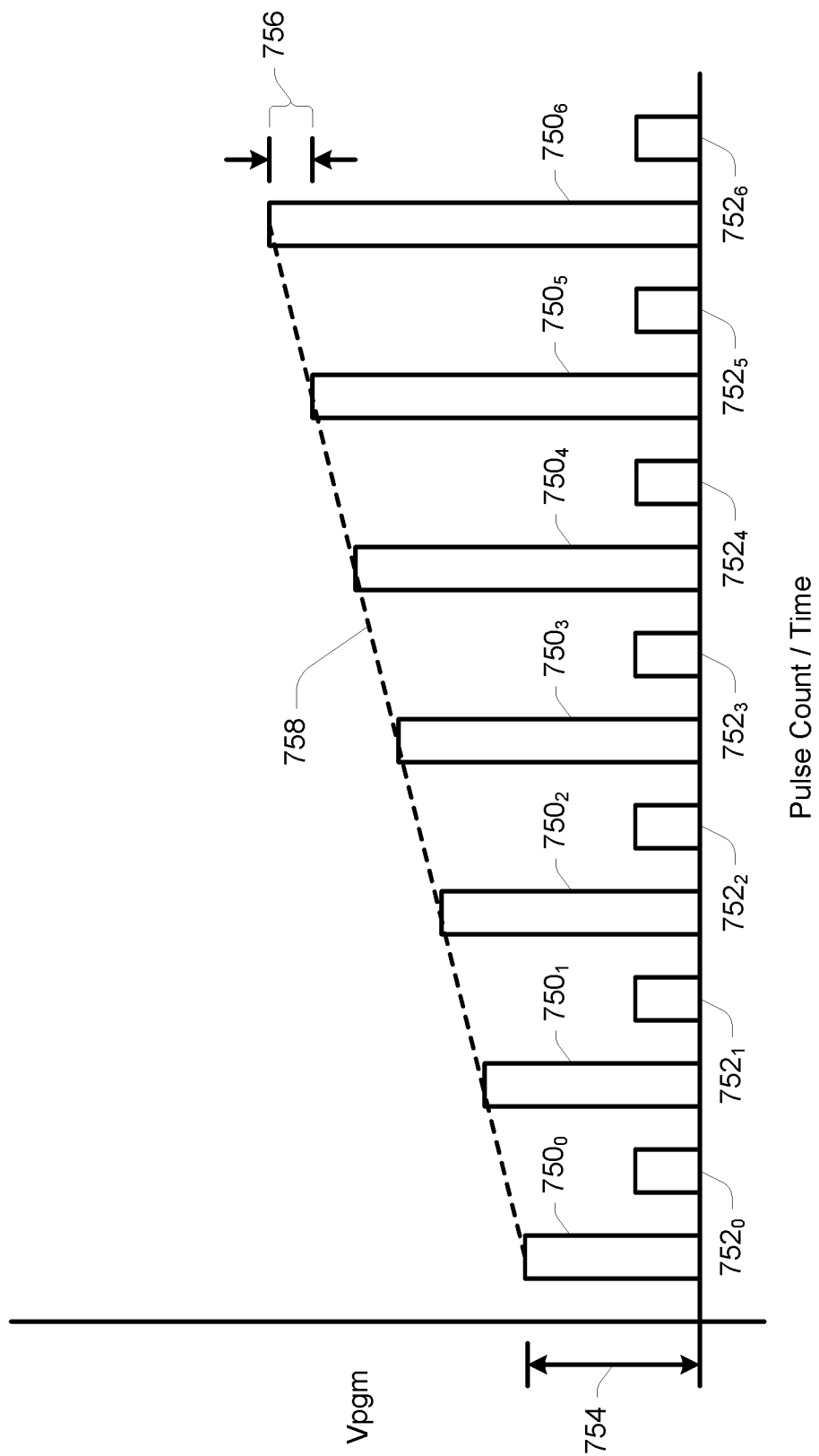
FIG. 7A shows a plot of an access line voltage versus time of a programming operation in accordance with embodiments.

FIG. 7A shows a plot of an access line voltage versus time of a programming operation in accordance with embodiments. While the programming voltages were depicted in FIG. 6 to be linear, programming voltages are often applied to an access line as a series of programming pulses of increasing voltage level, each followed by a verify pulse. Depicted in FIG. 7A is a series of programming pulses 750 (e.g., programming pulses $750_0$-$750_6$), which might each be followed by a verify pulse 752 (e.g., verify pulses $752_0$-$752_6$). Note that for embodiments storing more than one digit per memory cell, there may be more than one verify pulse 752, each with a different voltage level, to distinguish between more than two possible data states of the programming operation. In general, there might be one to N-1 verify pulses 752 following a programming pulse 750, where N equals a number of possible data states to be programmed to a plurality of memory cells during a programming operation. Similarly, for some embodiments, a programming pulse 750 might be followed by a subsequent programming pulse 750 without any intervening verify pulses 752. For example, the verify pulse $752_0$ might be eliminated if the programming pulse $750_0$ is not expected to result in any memory cell of the programming operation reaching a threshold voltage range corresponding to any data state other than the L0 data state. Although seven programming pulses 750 are depicted in FIG. 7A, typical programming operations might utilize different numbers (e.g., greater numbers) of programming pulses 750.

In FIG. 7A, the programming pulses 750 are depicted to have a programming start voltage, e.g., of an initial programming pulse $750_0$, having a voltage level 754. Each subsequent programming pulse might be higher than its immediately prior programming pulse 750 by a voltage difference ($\Delta V$) 756. The slope of the programming pulses 750 might be represented by the line 758, and might be deemed to have a slope equal to the voltage difference 756 (e.g., $\Delta V$ per one programming pulse). The voltage different 756 might be determined in response to a memory cell age of the memory cells undergoing the programming operation. It is recognized herein that even where values may be intended to be equal, variabilities and accuracies of industrial processing and operation may lead to differences from their intended values. These variabilities and accuracies will generally be dependent upon the technology utilized in fabrication and operation of the integrated circuit device. As such, if values are intended to be equal, those values are deemed to be equal regardless of their resulting values.

Figure 7B:
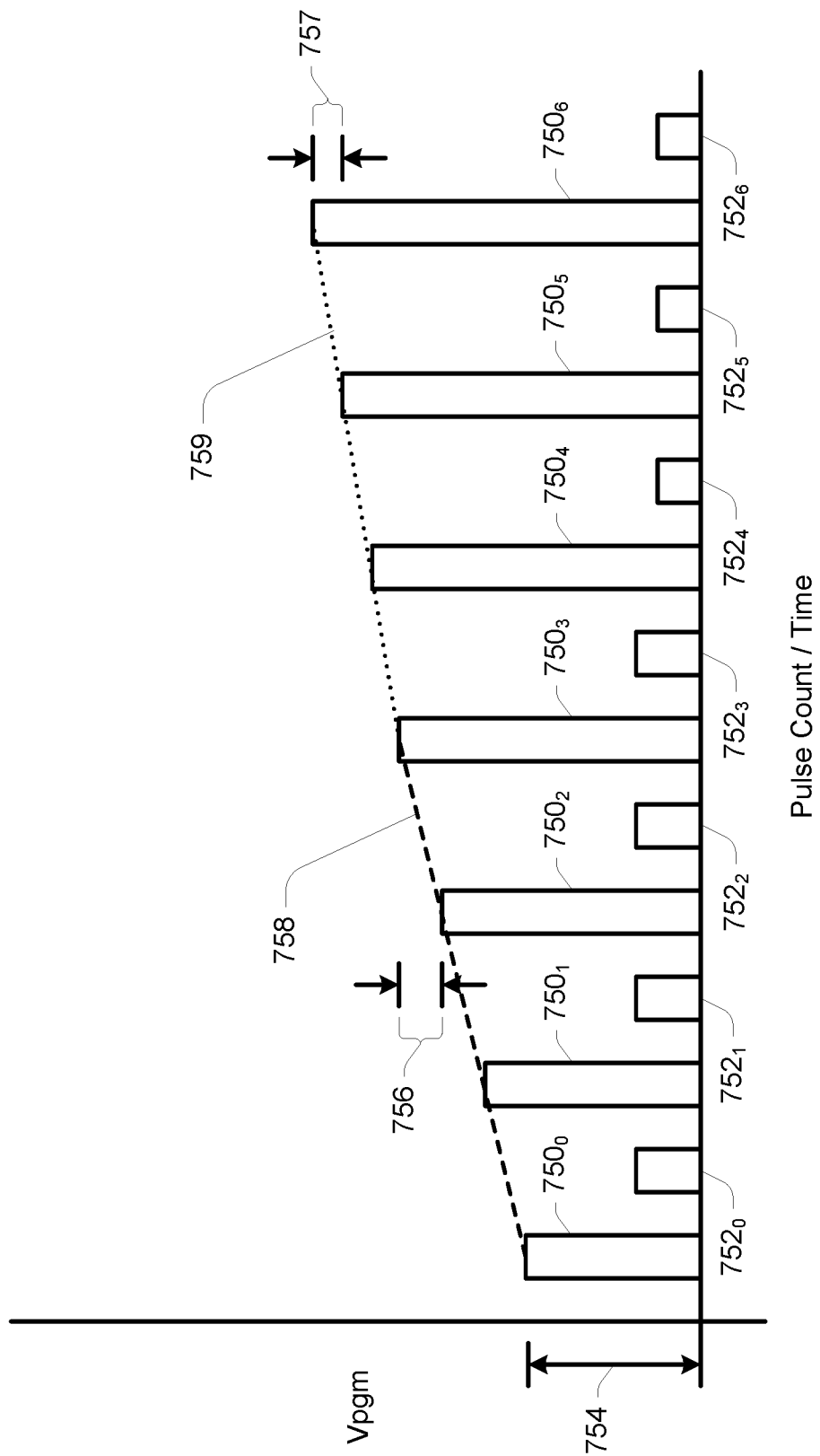
FIG. 7B shows a plot of an access line voltage versus time of a programming operation in accordance with other embodiments.

FIG. 7B shows a plot of an access line voltage versus time of a programming operation in accordance with other embodiments. While the programming voltages were depicted in FIG. 7A to have a constant slope, programming operations might use a first slope during one portion (e.g., an initial portion) of the programming operation, and might use a second slope during a different portion (e.g., a remaining portion) of the programming operation. Such programming operations might be thought of as using coarse and fine programming. For example, during the portion of the programming operation using the first slope of the programming voltages, the verify pulse (or verify pulses) might have a first voltage level (or first set of voltage levels) to determine when the memory cells are approaching their respective desired data states. When some criteria is met, e.g., when a particular number (e.g., one or more) of the memory cells of the programming operation are verified at the first voltage level(s), the slope of the programming voltages might be changed (e.g., reduced) for a remainder of the programming operation.

Depicted in FIG. 7B is a series of programming pulses 750 (e.g., programming pulses $750_0$-$750_6$), which might each be followed by a verify pulse 752 (e.g., verify pulses $752_0$-$752_6$). Note that for embodiments storing more than one digit per memory cell, there may be more than one verify pulse 752, each with a different voltage level, to distinguish between more than two possible data states of the programming operation. In general, there might be one to N-1 verify pulses 752 following a programming pulse 750, where N equals a number of possible data states to be programmed to a plurality of memory cells during a programming operation. Similarly, for some embodiments, a programming pulse 750 might be followed by a subsequent programming pulse 750 without any intervening verify pulses 752. For example, the verify pulse $752_0$ might be eliminated if the programming pulse $750_0$ is not expected to result in any memory cell of the programming operation reaching a threshold voltage range corresponding to any data state other than the L0 data state. Although seven programming pulses 750 are depicted in FIG. 7B, typical programming operations might utilize different numbers (e.g., greater numbers) of programming pulses 750.

In FIG. 7B, the programming pulses 750 are depicted to have a programming start voltage, e.g., of an initial programming pulse 750o, having a voltage level 754. Each subsequent programming pulse for a particular portion (e.g., initial portion) of the programming operation might be higher than its immediately prior programming pulse 750 by a voltage difference (AV) 756. The slope of the programming pulses 750 of the particular portion of the programming operation might be represented by the line 758, and might be deemed to have a slope equal to the voltage difference 756 (e.g., AV per one programming pulse). Using the assumption that the criteria was satisfied following the programming pulse $750_3$ and its verification, each subsequent programming pulse for a different portion (e.g., remaining portion) of the programming operation might be higher than its immediately prior programming pulse 750 by a voltage difference (AV) 757. The slope of the programming pulses 750 of the different portion of the programming operation might be represented by the line 759, and might be deemed to have a slope equal to the voltage difference 757 (e.g., AV per one programming pulse). The voltage difference 757 might be different than (e.g., less than) the voltage difference 756. At least one of the voltage difference 757 and the voltage difference 756 might be determined in response to a memory cell age of the memory cells undergoing the programming operation.

Figure 8B:
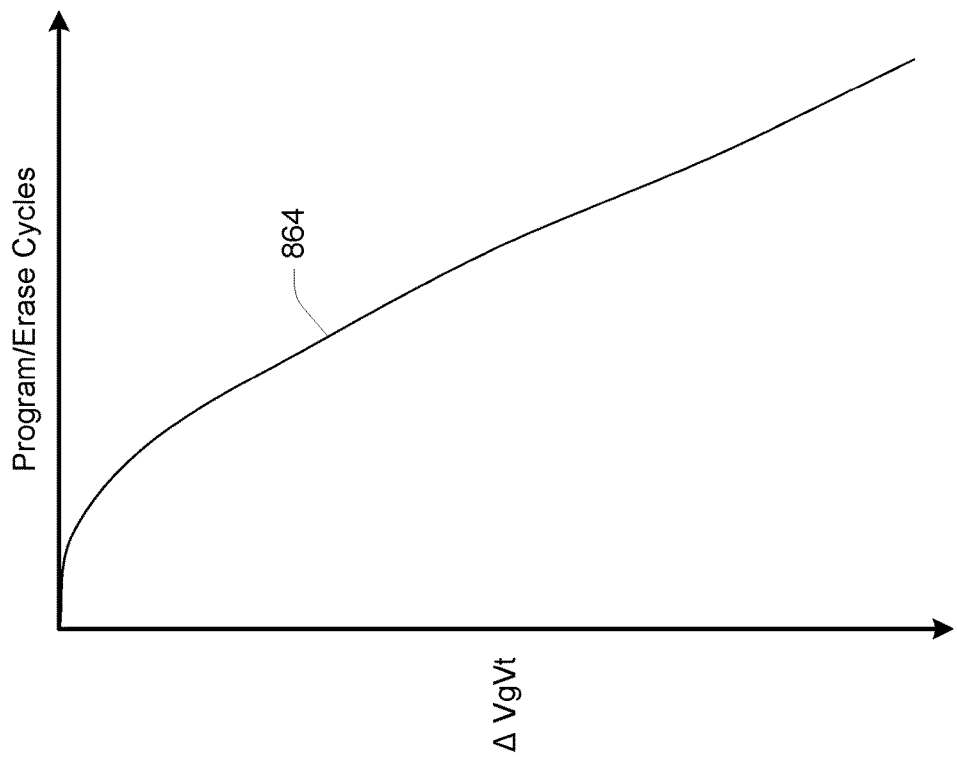
FIG. 8B depicts a plot of AVgVt versus program/erase cycles for use with embodiments.
Figure 8A:
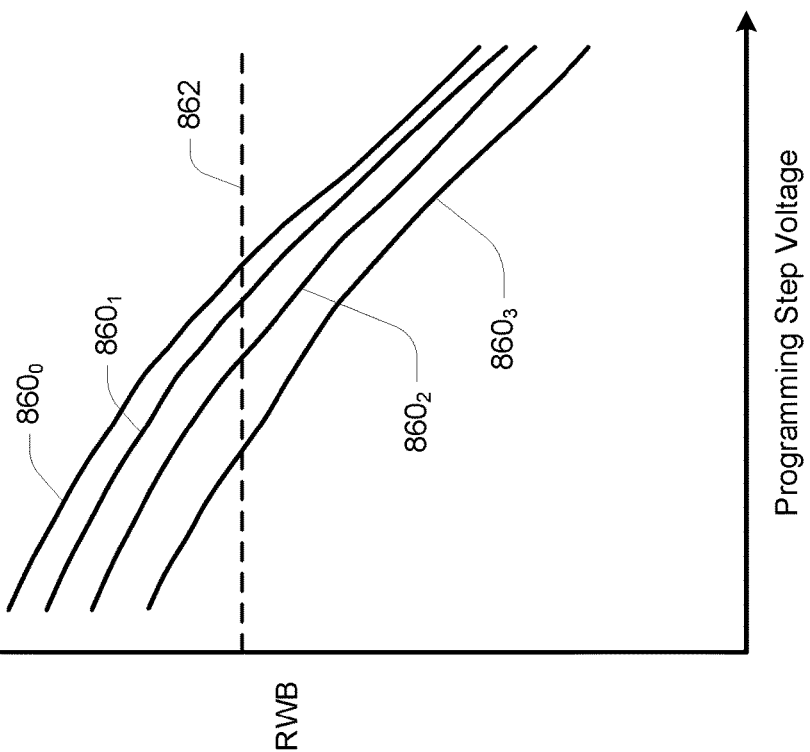
FIG. 8A depicts a plot of read window budget versus programming step voltage at various memory cell ages for use with embodiments.

FIG. 8A depicts a plot of read window budget versus programming step voltage at various memory cell ages for use with embodiments. As noted, various embodiments might select a programming step size for a particular memory cell age expected to produce an RWB that is within, but near, the capabilities of a selected error correction scheme. For various embodiments, this might include characterizing the performance of a memory at various memory cell ages. The performance characteristics of the memory, e.g., RWB as a function of programming step voltage, might, for example, be determined experimentally, empirically or through simulation.

In FIG. 8A, line $860_0$ might represent the plot of memory cells of a first memory cell age, e.g., having experienced a first number of (e.g., zero or very few) program/erase cycles, line $860_1$ might represent the plot of memory cells of a second memory cell age, e.g., having experienced a second number of program/erase cycles greater than the first number, line $860_2$ might represent the plot of memory cells of a third memory cell age, e.g., having experienced a third number of program/erase cycles greater than the second number, and line $860_3$ might represent the plot of memory cells of a fourth memory cell age, e.g., having experienced a fourth number of program/erase cycles greater than the third number. By selecting a desired RWB represented by line 862, a desired programming step voltage for each of the memory cell ages might be determined from the intersection of the line 862 with the relevant line 860.

Data for a plot of the type depicted in FIG. 8A might be determined by programming (e.g., simulating programming) of different pluralities of memory cells having a particular memory cell age using a number of respective programming step voltages, and then reading (e.g., simulating reading) the programmed memory cells to determine the resulting RWB for each of those programming step voltages to generate the data for one of the lines 860. This process could be repeated for different memory cell ages.

FIG. 8B depicts a plot of ΔVgVt versus program/erase cycles for use with embodiments. As noted, a memory cell that has been through no or very few program/erase cycles will typically require application of a higher voltage at its control gate to raise its threshold voltage by a particular amount as compared to a memory cell that has been through a higher number of cycles. This is generally indicated as VgVt, a relationship between an applied voltage level (e.g., a gate voltage Vg) across a memory cell to its resulting threshold voltage as an indication of a programming voltage sufficient to program a memory cell, or group of memory cells, to a particular threshold voltage, or range of threshold voltages. For example, if a voltage level of 13 volts is applied to a control gate of a memory cell whose body (e.g., channel) is at a ground potential (e.g., 0 volts), and the resulting threshold voltage is −0.5 volt, the VgVt for that memory cell is (13 volts−0 volts)−(−0.5 volts)=13.5 volts. Various embodiments might thus include characterizing the performance of a memory at various memory cell ages. The performance characteristics of the memory, e.g., the difference in VgVt (ΔVgVt) from some baseline value as a function of a number of program/erase cycles, might, for example, be determined experimentally, empirically or through simulation.

In FIG. 8B, line 864 might represent the plot of ΔVgVt as a function of a number of program/erase cycles. Thus, for a particular memory cell age (e.g., a particular number of program erase cycles), a programming start voltage might be determined by adding the ΔVgVt for that memory cell age to a baseline programming start voltage, e.g., a programming start voltage selected for a programming operation for memory cells having experienced zero program/erase cycles.

Data for a plot of the type depicted in FIG. 8B might be determined by applying a programming pulse (e.g., simulating applying a programming pulse) to control gates of a plurality of memory cells having different respective memory cell ages (e.g., program/erase cycles), and then reading (e.g., simulating reading) the programmed memory cells to determine the resulting VgVt to generate the data for the line 864.

Figure 9:
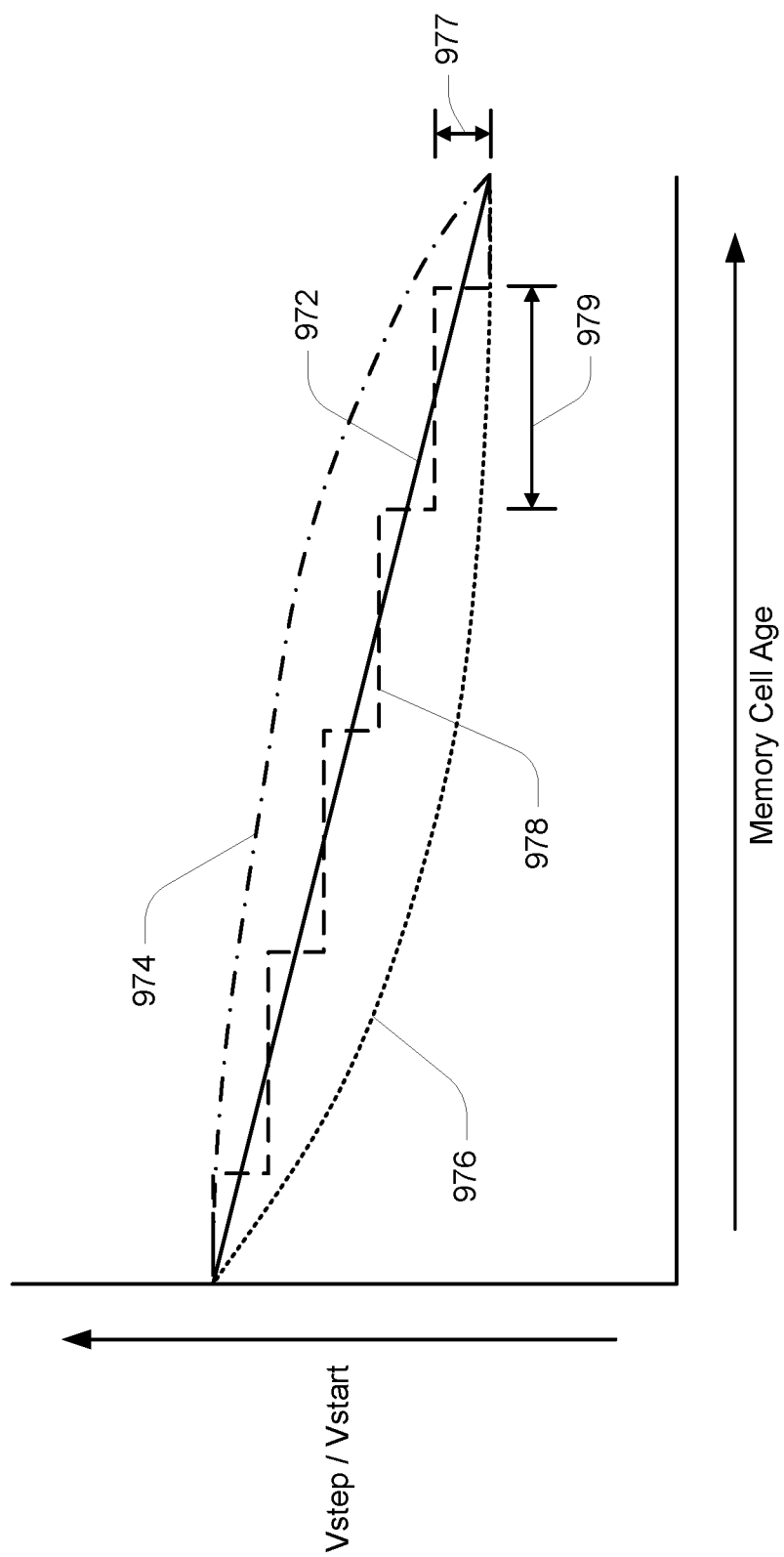
FIG. 9 depicts various decreasing functions for use with embodiments.

FIG. 9 depicts various examples of decreasing functions of memory cell age for use with embodiments. Decreasing functions of the type depicted in FIG. 9 might generally represent functions as might be used to determine programming step voltages and programming start voltages in accordance with embodiments. The abscissa and ordinate might independently utilize a linear, logarithmic or other scale, for example. Line 972 represents a linear decreasing function, e.g., having a constant negative slope. Line 974 represents a decreasing function of decreasing slope. For example, the function of line 974 may have a slope near zero at the lower range of memory cell age, and the slope of line 974 may decrease (e.g., become more negative) as the age is increased. Line 976 represents a decreasing function of increasing slope. For example, the function of line 976 may have a negative slope at the lower range of memory cell age, and the slope of line 976 may increase (e.g., become less negative) as the age is increased. Line 978 represents a stepped decreasing function having successively lower steps as the memory cell age is increased. Note that while steps of line 978 are depicted to have equal height 977 and equal length 979, these values could be varied. For example, a particular step may have a greater height 977 and lesser length 979 than a preceding step, or it may have a lesser height 977 and greater length 979 than a preceding step. Stepped functions may represent the use of a look-up table, where the value of the attribute (e.g., programming step or start voltage) is determined by looking up the value of the memory cell age (e.g., number of experienced program/erase cycles) in the table and selecting the value of the attribute corresponding to that age. Table 2 is a conceptual example of a look-up table. Look-up tables might be stored to the memory (e.g., to a trim register 128) to allow a controller (e.g., the control logic 116) to select the attribute in response to an indication of memory cell age. Alternatively, the value of the attribute for a decreasing function may be directly calculated from an equation of the decreasing function, e.g., Y=f(A), and constants of the equation might be stored to the memory (e.g., to a trim register 128) to allow a controller (e.g., the control logic 116) to calculate the attribute in response to an indication of memory cell age.

TABLE 2

Attribute Values (Y) as Function of Memory Cell Age (A)

| Memory Cell Age (A) | Attribute Value (Y) |
| --- | --- |
| A1 <= A < A2 | Y1 |
| A2 <= A < A3 | Y2 |
| A3 <= A < A4 | Y3 |
| A4 <= A <= A5 | Y4 |

While several examples of decreasing functions are described with reference to FIG. 9, other decreasing functions can be used where a value of the attribute at some relevant memory cell age is less than or equal to the value of the attribute (e.g., programming step or start voltage) at each lesser relevant memory cell age, and less than the value of the attribute for at least a subset of lesser memory cell ages. Decreasing functions described herein might, for example, be determined experimentally, empirically or through simulation.

Note that the decreasing functions may define attribute values for which the memory device is not configured to attain. This may be the result of configuration constraints, e.g., the memory device (e.g., controller of the memory device) might be configured to generate some limited number of different values for the attribute. For example, process variation among integrated circuit devices is to be expected, and memory device manufacturers often provide an ability at the time of fabrication to select values of such attributes as read voltages, program voltages, erase voltages, etc. to provide the expected performance of the memory device despite this process variation. This is often enabled by the use of trim registers, where different values of a trim register correspond to different values of an attribute. After testing of the memory device, these trim registers are set to select the desired attribute value for operation of the memory device. Typically, these trim registers contain one or more digits of storage (e.g., fuses, anti-fuses, memory cells, etc.), and each digital value of a trim register corresponds to a particular respective attribute value. A one-digit trim register can represent one of two attribute values, a two-digit trim register can represent one of up to four attribute values, a three-digit trim register can represent one of up to eight attribute values, etc.

Where a reprogrammable trim register (e.g., using memory cells) is used, the controller (e.g., the internal controller) of the memory device could set a register value to vary an attribute value for individual programming operations responsive to indications of memory cell age. Table 3 extends the example of Table 2 to show how trim registers might be used to select attribute values for the programming operation as a function of the indications of memory cell age using a two-digit trim register, while Table 4 extends the example of Table 3 to show how trim registers might be used to select attribute values for the programming operation as a function of the calculated attribute value using a two-digit trim register. Note that while Table 4 depicts the selected attribute value as a function of the calculated attribute value, it remains a function of the memory cell age as the calculated attribute value is a function of the memory cell age.

TABLE 3

Register Values and Attribute Values (Y) as Function of Memory Cell Age (A)

| Memory Cell Age (A) | Register Value | Attribute Value (Y) |
| --- | --- | --- |
| A1 <= A < A2 | 00 | Y1 |
| A2 <= A < A3 | 01 | Y2 |
| A3 <= A < A4 | 10 | Y3 |
| A4 <= A <= A5 | 11 | Y4 |

TABLE 4

Register Values and Attribute Values (Y) as Function of Calculated Attribute Value (Y')

| Calculated Attribute Value (Y') | Register Value | Attribute Value (Y) |
| --- | --- | --- |
| Y'1 <= Y' < Y'2 | 00 | Y1 |
| Y'2 <= Y' < Y'3 | 01 | Y2 |
| Y'3 <= Y' < Y'4 | 10 | Y3 |
| Y'4 <= Y' <= Y'5 | 11 | Y4 |

Figure 10:
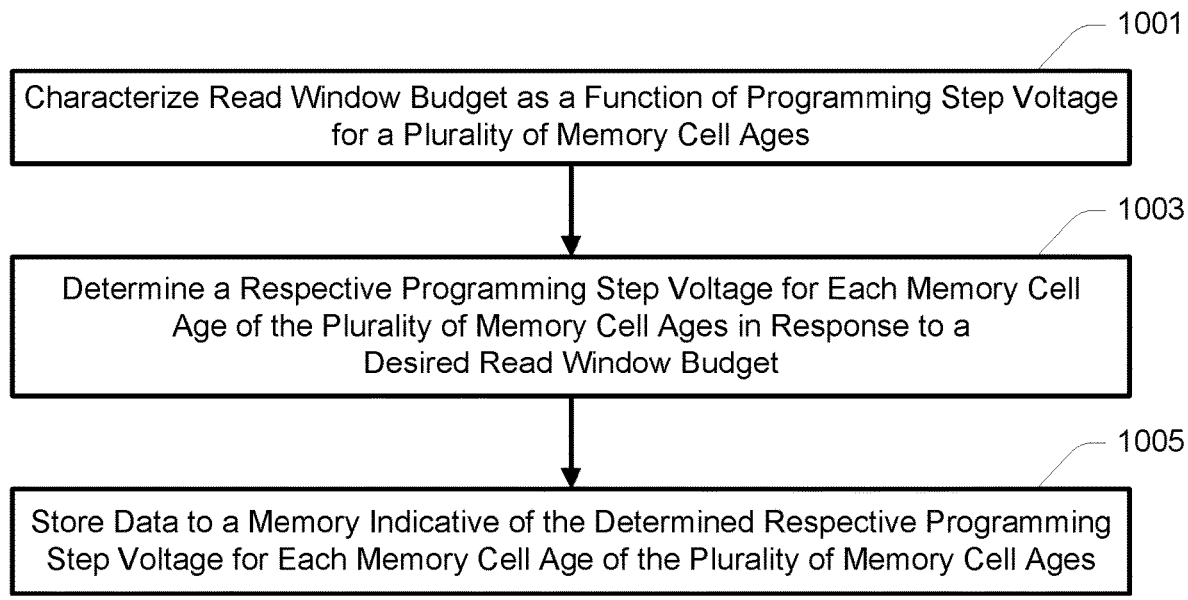
FIG. 10 is a flowchart of a method of configuring a memory in accordance with an embodiment.

FIG. 10 is a flowchart of a method of configuring a memory in accordance with an embodiment. At 1001, a read window budget as a function of programming step voltage might be characterized for a plurality of memory cell ages. The characterization could be determined experimentally, empirically or through simulation. The characterization might be a decreasing function for each memory cell age of the plurality of memory cell ages. Memory cell age might be indicated as a number of program/erase cycles experienced by memory cells being programmed.

At 1003, a respective programming step voltage for each memory cell age of the plurality of memory cell ages might be determined in response to a desired read window budget. The desired read window budget might be determined in response to a capability of an error correction scheme selected for operation of a memory. The desired read window budget might be determined to be greater than a minimum read window budget for which the selected error correction scheme is capable of correcting expected errors at a particular (e.g., desired maximum) data age. For example, if the error correction scheme is expected to correct X digits of erroneous data, the desired read window budget might be determined to be a read window budget that would be expected to generate some number of digits of erroneous data that is less than or equal to X as a result of time-dependent charge loss when the data reaches the particular data age.

At 1005, data indicative of the determined respective programming step voltage for each memory cell age of the plurality of memory cell ages might be stored to the memory. For example, data for a look-up table might be stored to the memory, or data corresponding to constants of an equation might be stored to the memory. A controller (e.g., control logic 116) of the memory might be configured to perform programming operations using the data indicative of the determined respective programming step voltage for each memory cell age of the plurality of memory cell ages.

Figure 11:
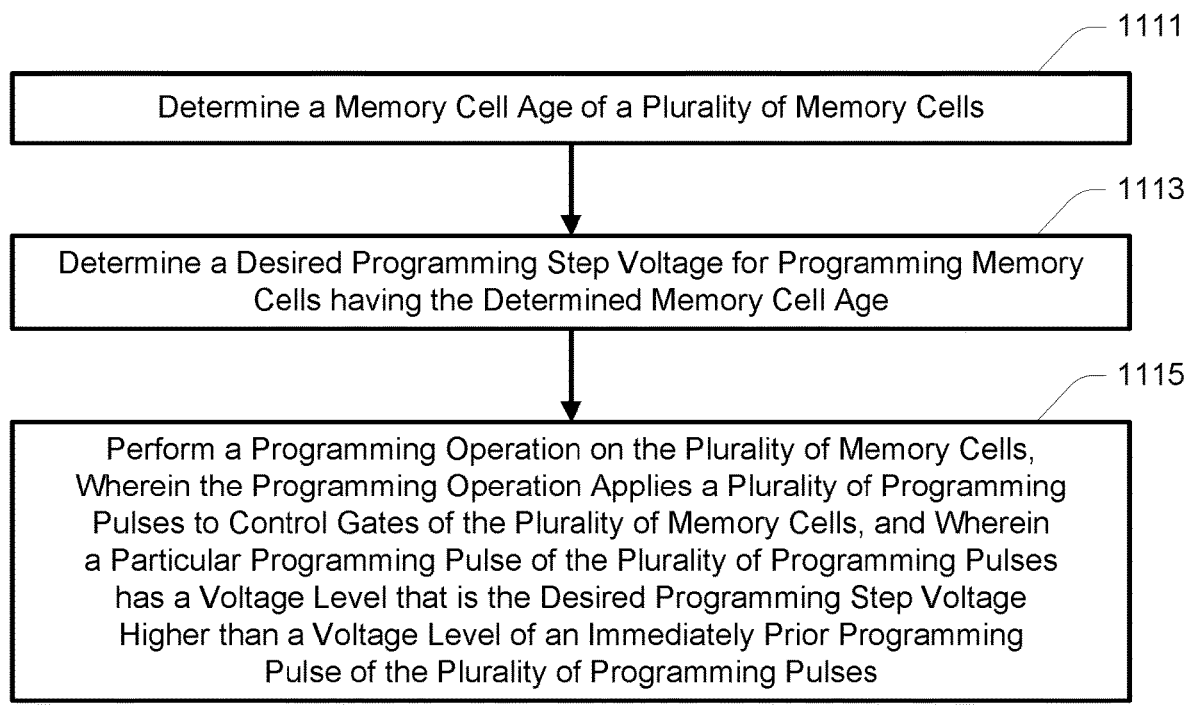
FIG. 11 is a flowchart of a method of operating a memory in accordance with another embodiment.

FIG. 11 is a flowchart of a method of operating a memory in accordance with an embodiment. At 1111, a memory cell age of a plurality of memory cells might be determined. Determining the memory cell age might include determining a number of program/erase cycles experienced by the plurality of memory cells. It is noted that blocks of memory cells are often erased together. As such, a number of erase operations performed on a block of memory cells might be deemed to correspond to a number of program/erase cycles experienced by any memory cell of that block of memory cells. In addition, a predetermined storage location of the block of memory cells, e.g., a particular number of memory cells of a particular physical row of memory cells of the block of memory cells, might store an indication of the number of erase operations performed on the block of memory cells. Accordingly, reading the predetermined storage location of the block of memory cells might be used to determine the memory cell age of a plurality of memory cells of that block of memory cells. Other indicators of memory cell age might be used in the alternative. For example, determining a VgVt of a memory cell could indicate a memory cell age, such as depicted in FIG. 8B.

At 1113, a desired programming step voltage for programming memory cells having the determined memory cell age might be determined. This might include calculating a programming step voltage using an equation, or using a look-up table. At 1115, a programming operation might be performed on the plurality of memory cells. The programming operation might apply a plurality of programming pulses to control gates of the plurality of memory cells. A particular programming pulse of the plurality of programming pulses might have a voltage level that is the desired programming step voltage higher than a voltage level of an immediately prior programming pulse of the plurality of programming pulses.

Figure 12:
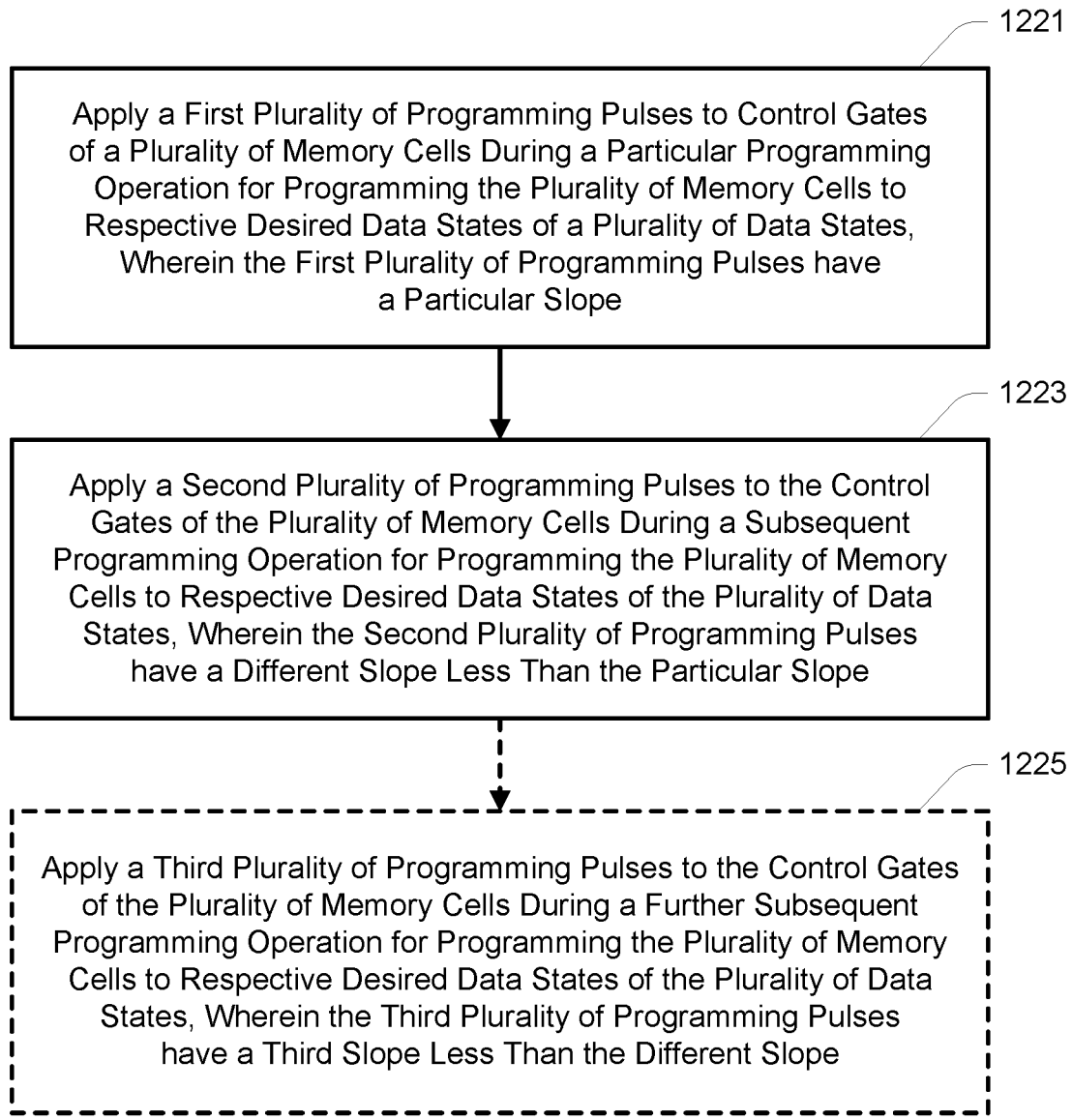
FIG. 12 is a flowchart of a method of operating a memory in accordance with a further embodiment.

FIG. 12 is a flowchart of a method of operating a memory in accordance with another embodiment. At 1221, a first plurality of programming pulses might be applied to control gates of a plurality of memory cells during a particular programming operation for programming the plurality of memory cells to respective desired data states of a plurality of data states. The first plurality of programming pulses might have a particular slope. For example, a difference in voltage level between a particular programming pulse of the first plurality of programming pulses and a prior (e.g., immediately prior) programming pulse of the first plurality of programming pulses might have a particular value, and a difference in voltage level between a subsequent (e.g., immediately subsequent) programming pulse of the first plurality of programming pulses and the particular programming pulse of the first plurality of programming pulses might have the particular value. For some embodiments, a difference in voltage level between a subsequent (e.g., immediately subsequent) programming pulse of the first plurality of programming pulses and any programming pulse of the first plurality of programming pulses might have the particular value. The particular slope might correspond to a memory cell age of the plurality of memory cells prior to performing the particular programming operation.

At 1223, a second plurality of programming pulses might be applied to the control gates of the plurality of memory cells during a subsequent programming operation (e.g., subsequent to the particular programming operation) for programming the plurality of memory cells to respective desired data states of the plurality of data states. The second plurality of programming pulses might have a different slope less than the particular slope. For example, a difference in voltage level between a particular programming pulse of the second plurality of programming pulses and a prior (e.g., immediately prior) programming pulse of the second plurality of programming pulses might have a different value, less than the particular value, and a difference in voltage level between a subsequent (e.g., immediately subsequent) programming pulse of the second plurality of programming pulses and the particular programming pulse of the second plurality of programming pulses might have the different value. For some embodiments, a difference in voltage level between a subsequent (e.g., immediately subsequent) programming pulse of the second plurality of programming pulses and any programming pulse of the second plurality of programming pulses might have the different value. The particular slope might correspond to a memory cell age of the plurality of memory cells prior to performing the subsequent programming operation.

The method of FIG. 12 might be continued for one or more additional programming operations. For example, at 1225, a third plurality of programming pulses might be applied to the control gates of the plurality of memory cells during a further subsequent programming operation (e.g., subsequent to the subsequent programming operation) for programming the plurality of memory cells to respective desired data states of the plurality of data states. The third plurality of programming pulses might have a third slope less than the different slope. For example, a difference in voltage level between a particular programming pulse of the third plurality of programming pulses and a prior (e.g., immediately prior) programming pulse of the third plurality of programming pulses might have a third value, less than the different value, and a difference in voltage level between a subsequent (e.g., immediately subsequent) programming pulse of the third plurality of programming pulses and the particular programming pulse of the third plurality of programming pulses might have the third value. For some embodiments, a difference in voltage level between a subsequent (e.g., immediately subsequent) programming pulse of the third plurality of programming pulses and any programming pulse of the third plurality of programming pulses might have the third value. The particular slope might correspond to a memory cell age of the plurality of memory cells prior to performing the next subsequent programming operation.

In the method of FIG. 12, one or more intervening programming operations might be performed between the particular programming operation of the plurality of memory cells and the subsequent programming operation of the plurality of memory cells. In addition, one or more of the intervening programming operations might apply respective pluralities of programming pulses having the particular slope, having the different slope, or having a respective slope less than the particular slope and greater than the different slope. Furthermore, one or more intervening programming operations might be performed between the subsequent programming operation of the plurality of memory cells and the further subsequent programming operation of the plurality of memory cells, and one or more of these intervening programming operations might apply respective pluralities of programming pulses having the different slope, having the third slope, or having a respective slope less than the different slope and greater than the third slope.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
    determining a first memory cell age for performing a particular programming operation for programming a plurality of memory cells from a lowest data state of a plurality of data states to respective desired data states of the plurality of data states;
    determining a particular slope in response to the first memory cell age and a desired read window budget;
    applying a first plurality of programming pulses to control gates of the plurality of memory cells during the particular programming operation, wherein the first plurality of programming pulses have the particular slope;

determining a second memory cell age for performing a subsequent programming operation for programming the plurality of memory cells from the lowest data state of the plurality of data states to respective desired data states of the plurality of data states;

determining a different slope in response to the second memory cell age and the desired read window budget; and applying a second plurality of programming pulses to the control gates of the plurality of memory cells during the subsequent programming operation, wherein the second plurality of programming pulses have the different slope;

wherein the respective desired data state for at least one memory cell of the plurality of memory cells is different than the lowest data state of the plurality of data states for at least one programming operation selected from a group consisting of the particular programming operation and the subsequent programming operation;

wherein applying the first plurality of programming pulses to the control gates of the plurality of memory cells during the particular programming operation comprises applying an initial programming pulse of the first plurality of programming pulses to the control gates of the plurality of memory cells while each memory cell of the plurality of memory cells has the lowest data state of the plurality of data states; and wherein applying the second plurality of programming pulses to the control gates of the plurality of memory cells during the subsequent programming operation comprises applying an initial programming pulse of the second plurality of programming pulses to the control gates of the plurality of memory cells while each memory cell of the plurality of memory cells has the lowest data state of the plurality of data states.

2. The method of claim 1, wherein determining the first memory cell age and determining the second memory cell age comprises determining a number of program/erase cycles experienced by the plurality of memory cells prior to the particular programming operation and prior to the subsequent programming operation, respectively.

3. The method of claim 1, further comprising:
applying a third plurality of programming pulses to the control gates of the plurality of memory cells during an intervening programming operation for programming the plurality of memory cells to respective desired data states of the plurality of data states;

wherein the intervening programming operation is performed after the particular programming operation and before the subsequent programming operation.

4. The method of claim 3, wherein applying the third plurality of programming pulses comprises applying the third plurality of programming pulses having the particular slope.

5. The method of claim 3, wherein applying the third plurality of programming pulses comprises applying the third plurality of programming pulses having the different slope.

6. The method of claim 3, wherein applying the third plurality of programming pulses comprises applying the third plurality of programming pulses having a third slope less than the particular slope and greater than the different slope.

7. The method of claim 1, further comprising:
determining a third memory cell age for performing a next subsequent programming operation for programming the plurality of memory cells to respective desired data states of the plurality of data states;

determining a third slope in response to the third memory cell age and the desired read window budget; and applying a third plurality of programming pulses to the control gates of the plurality of memory cells during the next subsequent programming operation, wherein the third plurality of programming pulses have the third slope.

8. The method of claim 7, wherein applying the second plurality of programming pulses having the different slope and applying the third plurality of programming pulses having the third slope, comprises applying the second plurality of programming pulses having the different slope that is less than the particular slope, and applying the third plurality of programming pulses having the third slope that is less than the different slope.

9. The method of claim 1, wherein the first plurality of programming pulses have a particular programming start voltage and wherein the second plurality of programming pulses have a different programming start voltage less than the particular programming start voltage.

10. The method of claim 9, further comprising:
selecting the particular programming start voltage in response to the first memory cell age; and
selecting the different programming start voltage in response to the second memory cell age.

11. A memory, comprising:
an array of memory cells; and
a controller configured to access the array of memory cells;

wherein the controller is configured to:
determine a first memory cell age for performing a particular programming operation for programming a plurality of memory cells of the array of memory cell from a lowest data state of a plurality of data states to respective desired data states of the plurality of data states;

determine a particular slope in response to the first memory cell age and a desired read window budget;

apply a first plurality of programming pulses to control gates of the plurality of memory cells during the particular programming operation, wherein the first plurality of programming pulses have the particular slope;

determine a second memory cell age for performing a subsequent programming operation for programming the plurality of memory cells from the lowest data state of the plurality of data states to respective desired data states of the plurality of data states;

determine a different slope in response to the second memory cell age and the desired read window budget; and apply a second plurality of programming pulses to the control gates of the plurality of memory cells during the subsequent programming operation for programming the plurality of memory cells from the lowest data state of the plurality of data states to respective desired data states of the plurality of data states, wherein the second plurality of programming pulses have the different slope;

wherein the respective desired data state for at least one memory cell of the plurality of memory cells is different than the lowest data state of the plurality of data states for at least one programming operation selected from a group consisting of the particular programming operation and the subsequent programming operation;

wherein the controller being configured to apply the first plurality of programming pulses to the control gates of the plurality of memory cells during the particular programming operation comprises the controller being configured to apply an initial programming pulse of the first plurality of programming pulses to the control gates of the plurality of memory cells while each memory cell of the plurality of memory cells has the lowest data state of the plurality of data states; and wherein the controller being configured to apply the second plurality of programming pulses to the control gates of the plurality of memory cells during the subsequent programming operation comprises the controller being configured to apply an initial programming pulse of the second plurality of programming pulses to the control gates of the plurality of memory cells while each memory cell of the plurality of memory cells has the lowest data state of the plurality of data states.

12. The memory of claim 11, wherein the controller being configured to determine the first memory cell age and to determine the second memory cell age comprises the controller being configured to determine a number of program/erase cycles experienced by the plurality of memory cells prior to the programming operation and prior to the subsequent programming operation, respectively.

13. The memory of claim 11, wherein the controller is further configured to:

apply a third plurality of programming pulses to the control gates of the plurality of memory cells during an intervening programming operation for programming the plurality of memory cells to respective desired data states of the plurality of data states;

wherein the intervening programming operation is performed after the particular programming operation and before the subsequent programming operation.

14. The memory of claim 13, wherein the controller being configured to apply the third plurality of programming pulses comprises the controller being configured to apply the third plurality of programming pulses having a slope selected from a group consisting of the particular slope and the different slope.

15. The memory of claim 11, wherein the controller is further configured to:

determine a third memory cell age for performing a next subsequent programming operation for programming the plurality of memory cells from the lowest data state of the plurality of data states to respective desired data states of the plurality of data states;

determine a third slope in response to the third memory cell age and the desired read window budget; and apply a third plurality of programming pulses to the control gates of the plurality of memory cells during the next subsequent programming operation, wherein the third plurality of programming pulses have the third slope.

16. The memory of claim 11, wherein the first plurality of programming pulses have a particular programming start voltage and wherein the second plurality of programming pulses have a different programming start voltage less than the particular programming start voltage.

17. The memory of claim 16, wherein the controller is further configured to:

select the particular programming start voltage in response to the first memory cell age; and select the different programming start voltage in response to the second memory cell age.

18. A memory, comprising:

an array of memory cells; and a controller configured to access the array of memory cells;

wherein the controller is configured to:

determine a memory cell age of a plurality of memory cells for performing a particular programming operation for programming the plurality of memory cells to respective desired data states of a plurality of data states;

determine a first start voltage for a first plurality of programming pulses in response to the determined memory cell age for performing the particular programming operation;

determine a first slope for the first plurality of programming pulses in response to the determined memory cell age for performing the particular programming operation, and to a desired read window budget;

apply the first plurality of programming pulses, having the first slope and the first start voltage, to control gates of the plurality of memory cells during the particular programming operation;

determine a memory cell age of the plurality of memory cells for performing a subsequent programming operation for programming the plurality of memory cells to respective desired data states of the plurality of data states;

determine a second start voltage for a second plurality of programming pulses in response to the determined memory cell age for performing the subsequent programming operation, and wherein the second start voltage is less than the first start voltage;

determine a second slope for the second plurality of programming pulses in response to the determined memory age for performing the subsequent programming operation, and to the desired read window budget, wherein the second slope is less than the first slope, and apply the second plurality of programming pulses, having the second slope and the second start voltage, to the control gates of the plurality of memory cells during the subsequent programming operation;

wherein the controller being configured to apply the first plurality of programming pulses to the control gates of the plurality of memory cells during the particular programming operation comprises the controller being configured to apply an initial programming pulse of the first plurality of programming pulses to the control gates of the plurality of memory cells while each memory cell of the plurality of memory cells has the lowest data state of the plurality of data states; and wherein the controller being configured to apply the second plurality of programming pulses to the control gates of the plurality of memory cells during the subsequent programming operation comprises the controller being configured to apply an initial programming pulse of the second plurality of programming pulses to the control gates of the plurality of memory cells while each memory cell of the plurality of memory cells has the lowest data state of the plurality of data states.

19. The memory of claim 18, wherein the controller is further configured to correct errors from reading data from the plurality of memory cells using an error correction scheme having a capability of correcting a first number of errors, and wherein the desired read budget has a value configured to produce a second number of errors that is less than or equal to the first number of errors.

20. The memory of claim 18, further comprising:
a look-up table containing a plurality of register values determined as a function of memory cell age for the desired read window budget;
wherein the controller being configured to determine the first slope for the first plurality of programming pulses in response to the determined memory cell age for performing the particular programming operation, and to a desired read window budget, comprises the controller being configured to:
look up a value of the determined memory cell age for performing the particular programming operation in the look-up table;
select a particular register value of the plurality of register values corresponding to that determined memory cell age; and
generate the first slope for the first plurality of programming pulses in response to the particular register value.

\* \* \* \* \*